United States Patent [19]
Komoto

[11] Patent Number: 5,159,530
[45] Date of Patent: Oct. 27, 1992

[54] ELECTRONIC CIRCUIT MODULE WITH POWER FEED SPRING ASSEMBLY

[75] Inventor: Mitsuo Komoto, Tokyo, Japan

[73] Assignee: NEC Corporation, Tokyo, Japan

[21] Appl. No.: 716,886

[22] Filed: Jun. 18, 1991

[30] Foreign Application Priority Data

Jun. 18, 1990 [JP] Japan .................. 2-159152

[51] Int. Cl.$^5$ .............................................. H05K 7/20
[52] U.S. Cl. ..................................... 361/386; 174/51;
361/414; 439/92
[58] Field of Search ............................... 361/382–389,
361/400, 403, 410, 413, 414, 424; 174/51, 52.1,
252, 260, 52.4; 439/92, 95, 96, 607, 485; 357/81,
82; 165/80.3, 80.4

[56] References Cited

U.S. PATENT DOCUMENTS

| | | | |
|---|---|---|---|
| 4,652,970 | 3/1987 | Watari | 361/385 |
| 4,711,506 | 12/1987 | Tanaka | 439/108 |
| 4,744,007 | 3/1988 | Watari | 361/386 |
| 4,771,366 | 9/1988 | Blake | 361/387 |
| 4,860,165 | 8/1989 | Cassinelli | 361/388 |
| 4,889,959 | 12/1989 | Taylor | 174/35 GC |
| 5,061,192 | 10/1991 | Chapin | 439/66 |

Primary Examiner—Gerald P. Tolin
Attorney, Agent, or Firm—Sughrue, Mion, Zinn, Macpeak & Seas

[57] ABSTRACT

In an electronic circuit module, an array of male connectors (41, 46) are arranged on a ceramic substrate (40) to establish contact with external female connectors (20) and an array of LSI packages (5) is provided. Conductive layers (43) of power distribution pattern are embedded in the substrate and are coupled to the male connectors (41). Each LSI package includes a conductive housing (52), an LSI chip (50) secured thereto in a thermally conductive relationship and a base plate (51) which establishes source/ground current conduction paths between the chip and the housing and drain-/source current conduction paths between the chip and appropriate layers of the ceramic substrate. An array of conductive springs (68) are supported by a lattice structure (60, 64) to establish a pressure contact with the housing of successive LSI packages to allow power currents to be supplied from an external source voltage terminal to all LSI packages. An array of cooling surfaces (73) are in thermal contact with the respective package housings through the apertures (62) of the lattice structure.

8 Claims, 4 Drawing Sheets

ELECTRONIC CIRCUIT MODULE WITH POWER FEED SPRING ASSEMBLY

BACKGROUND OF THE INVENTION

The present invention relates generally to LSI (large scale integration) modules, and more specifically to the power feed system of LSI modules.

With prior art LSI modules as typically shown and described in U.S. Pat. No. 4,652,970, all source/ground currents are conducted by way of power and ground pins which are arranged on a substrate together with signal pins, all the pin connectors being adapted for connection to an external printed circuit board. However, to achieve high packing density, difficulty arises in embedding many layered power distribution patterns in the printed circuit board due to the increasing thickness to throughhole diameter ratio. Another disadvantage is that the path length of source/ground currents between the printed circuit board and the LSI chips is long and therefore a substantial voltage drop occurs.

SUMMARY OF THE INVENTION

It is therefore an object of the present invention to provide an electronic circuit module which allows reduction of the power distribution layers buried in printed circuit boards and is capable of meeting large current requirements without causing substantial voltage drops.

The stated object of this invention is achieved by separating the paths of power currents into source and ground terminal sides and using pin connectors for carrying exclusively the currents of one side.

According to the present invention, there is provided an electronic circuit module which comprises a ceramic substrate having an array of male connectors arranged thereon to establish contact with external female connectors and conductive layers of power distribution pattern embedded therein and coupled to the male connectors. An array of integrated circuit packages are provided, each package including an electrically conductive cap or housing, an integrated circuit chip secured thereto in a thermally conductive relationship and a base plate. The latter includes a conductive pattern connected to the conductive housing. Each package establishes source/ground current conduction paths between the conductive pattern and the integrated circuit chip and drain/source current conduction paths between the integrated circuit chip and the layer of the ceramic substrate. An array of conductive springs are supported in pressure contact relationship the housings of successive integrated circuit packages to establish source/ground conduction paths between the packages and an external source voltage terminal. A cooling means is provided for defining an array of cooling surfaces respectively contacting the housings of the integrated circuit packages in a thermally conductive relationship.

Preferably, the conductive springs are supported between first and second lattice structures of crossed bars. The first lattice structure is formed of conductive material and defines an array of apertures for positioning the integrated circuit packages therein so that they contact with the cooling surfaces, respectively. The second lattice structure is preferably formed of nonconductive material and defines an array of apertures corresponding respectively to the apertures of the first lattice structure for positioning the integrated circuit packages so that they establish electrical contacts with the layers of the insulative substrate.

BRIEF DESCRIPTION OF THE DRAWINGS

The present invention will be described in further detail with reference to the accompanying drawings, in which.

DETAILED DESCRIPTION

Figure 1:
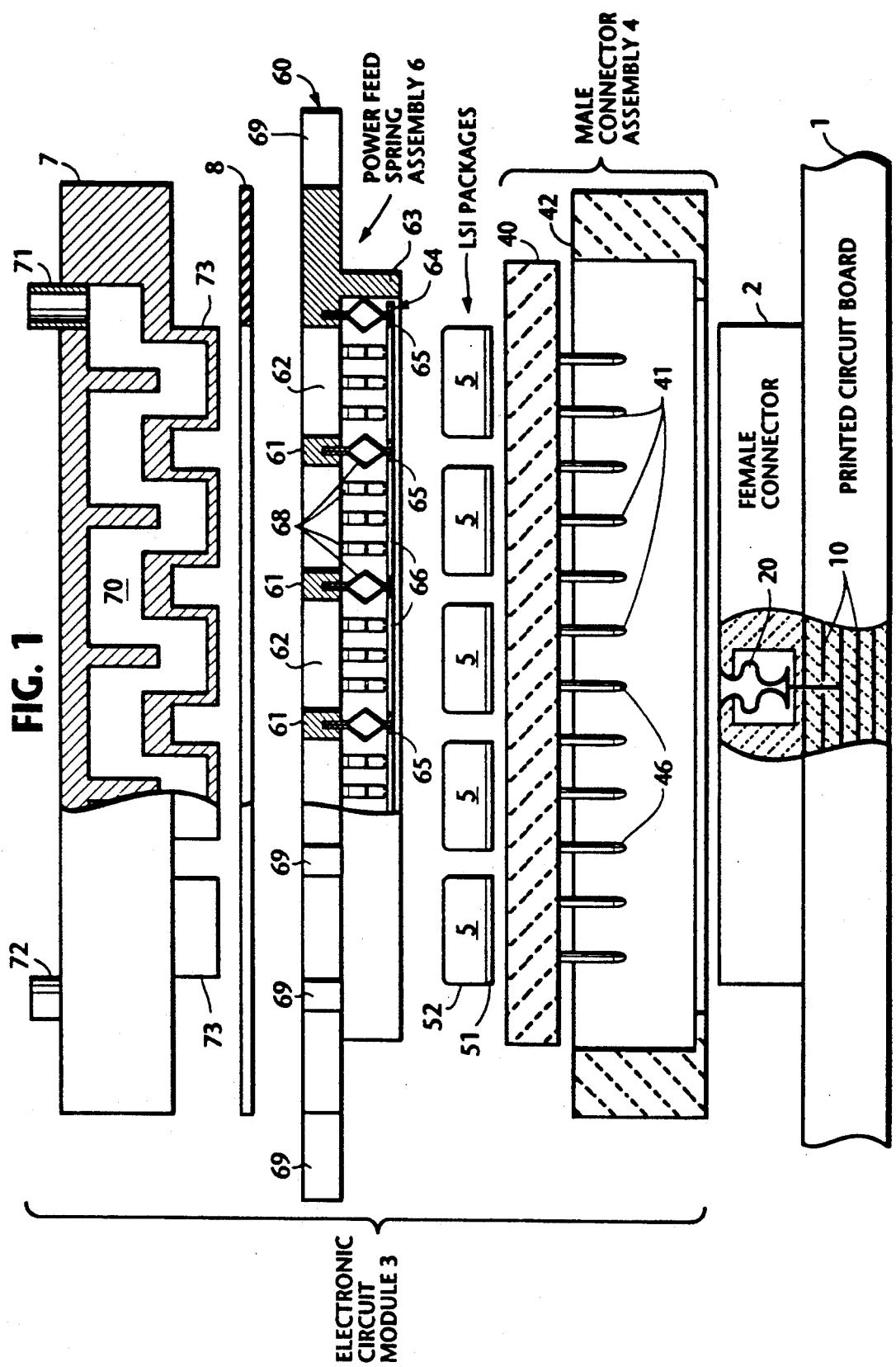
FIG. 1 is an exploded view, partly in cross-section, of an electronic circuit module of the present invention in relation to a printed circuit board.
Figure 2:
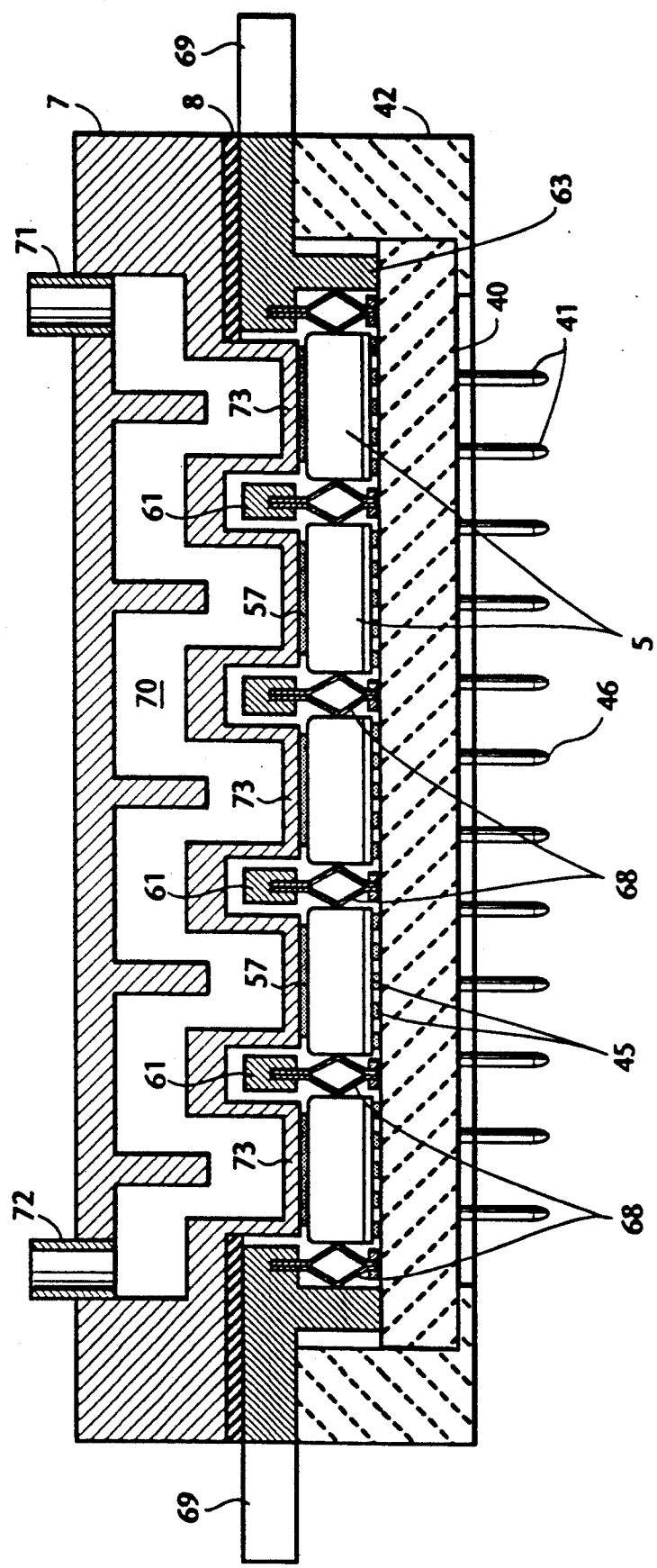
FIG. 2 is a cross-sectional view of the electronic circuit module of the present invention when assembled.

In FIGS. 1 and 2, the electronic circuit module of this invention is generally shown at 3 which is adapted to be used for connection to a printed circuit board 1 by way of a female connector 2 in which an array of contacts 20 is provided. Module 3 comprises a male connector assembly 4 having a ceramic substrate 40, an array of ground pins 41 and signal pins 46 juxtaposed on the lower surface of substrate 40, and a ceramic frame 42 in which the substrate 40 is secured. An array of LSI packages 5 are provided between the ceramic substrate 40 and a power feed spring assembly 6 that is held in position between the upper edge of frame structure 42 and a cooling device 7 with an insulating spacer 8 interposed therebetween.

Printed circuit board 1 has conductive layers 10 of power distribution pattern embedded therein, which are suitably connected to the contacts 20 of the female connector with which the pins 41 and 46 of the male connector assembly respectively engage.

Figure 3:
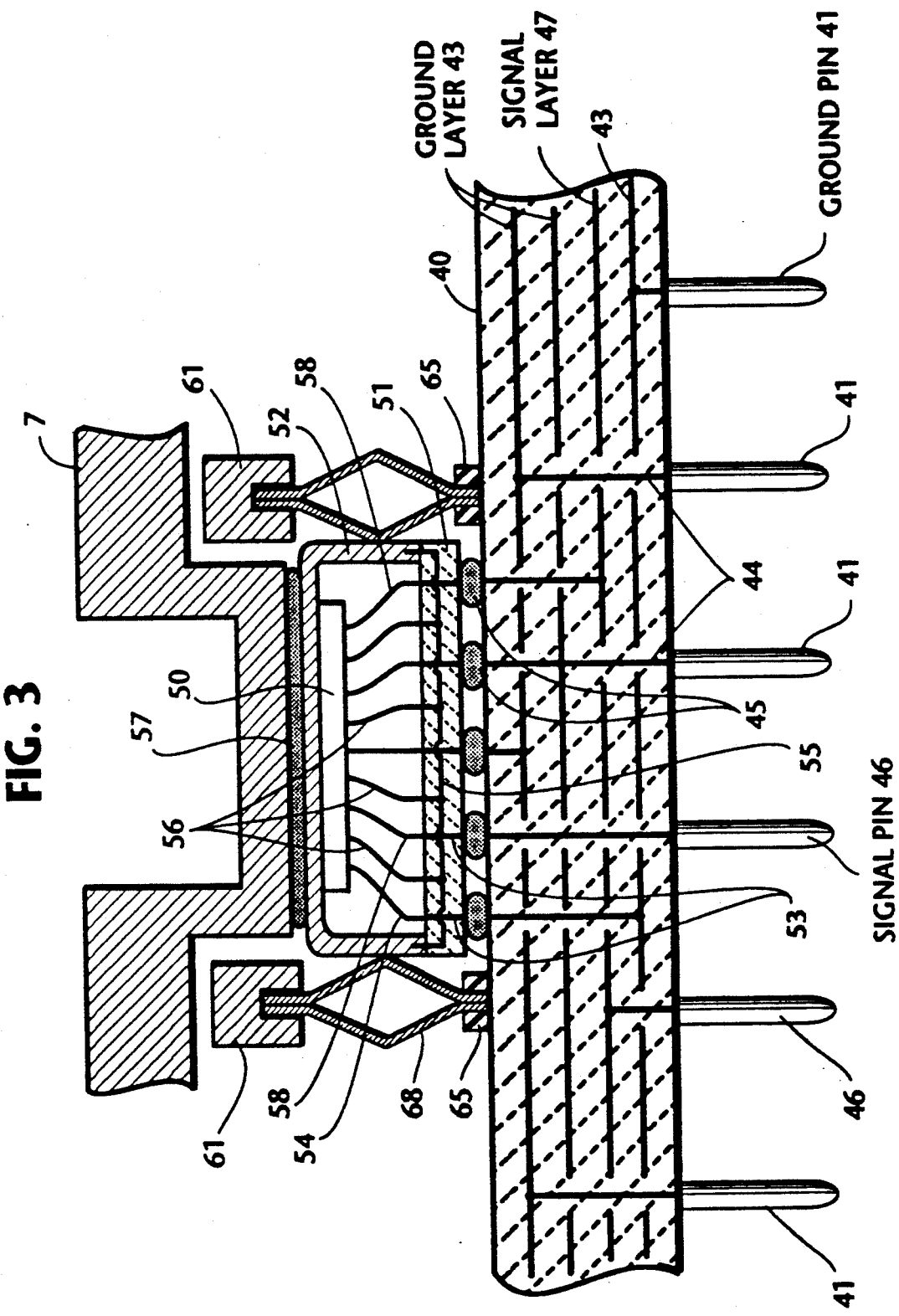
FIG. 3 is an enlarged view in cross-section of a portion of the electronic circuit module of this invention.

As shown in detail in FIG. 3, ceramic substrate 40 has conductive layers 43 of power distribution pattern and vertical conducting paths 44 for coupling the layers 43 to the ground pins 41 and further to solder terminals appearing on the upper surface of ceramic substrate 40. A signal layer 47 is also buried in the substrate 40 for coupling signal pins 46 to appropriate solder terminals. Each of the LSI packages 5 has a base plate 51 and a conductive cap 52. An LSI chip 50 is cemented to the ceiling of the conductive cap 52 to establish as high a thermally conductive relationship as possible with the cooling device 7. Base plate 51 has embedded conductors 53 which are coupled to the soldering terminals on the ceramic substrate 40 by solder points 45 and coupled to the LSI chip 50 by ground leads 54 and signal leads 58. Base plate 51 has a power conductive pattern 55 that is connected by leads 56 to the LSI chip 50.

Figure 4:
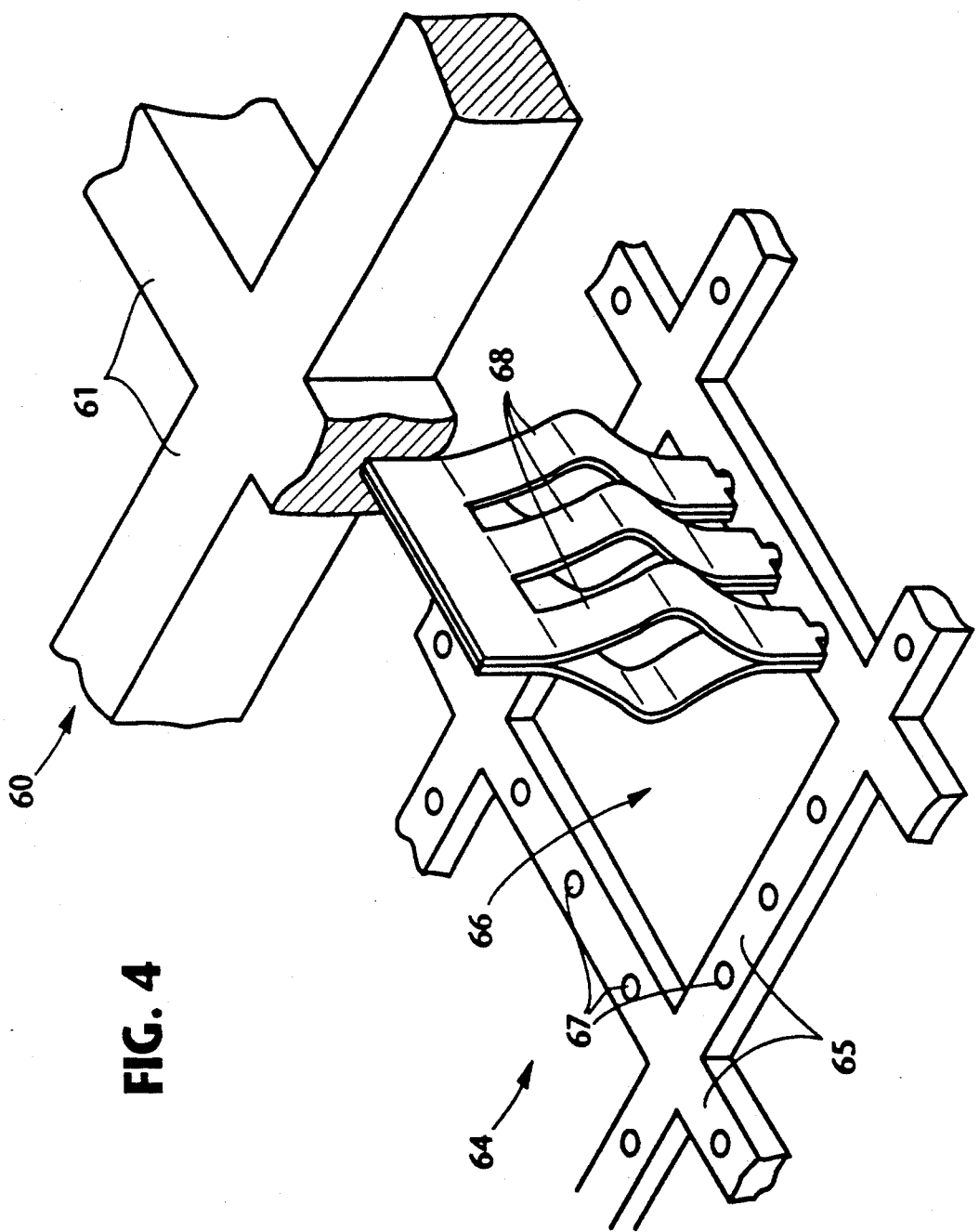
FIG. 4 is a perspective view of a portion of the power feed spring assembly of this invention.

Power feed spring assembly 6 comprises a conductive, upper lattice structure 60 of crossed bars 61 defining a rectangular array of square apertures 62. Lattice structure 60 has an outer wall portion 69 that extends downwards from the outer edge portions thereof. The spring assembly 6 further includes a lower lattice structure 64 of crossed bars 65 defining an array of square apertures 66 corresponding in position to the square apertures 62 of the upper lattice structure. Lower lattice structure 64 is formed of insulative material to prevent springs 68 from contacting with soldered conductive surface portions of ceramic substrate 40. As shown in detail in FIG. 4, each of the crossed bars 65 of the lower lattice structure is formed with spring alignment holes 67 for supporting and aligning an array of springs 68 of paired bow-like configuration suspending from the upper lattice structure. In the illustrated embodiment, the leaf springs 68 are grouped to form a plurality of sets of three springs each. The upper ends of the springs of each set are firmly secured in a slit provided on the lower side of each crossed bar 61 of the upper lattice structure and their lower ends are engaged in the alignment holes 67 of the lower lattice structure. In this way, springs 68 of each set are aligned parallel with the side walls of adjacent LSI packages 5.

During manufacture, LSI packages 5, cemented to the ceramic substrate 40 by solder points 45, are moved passing through corresponding apertures 66 of the lower lattice structure against lateral forces of the springs 68 until ceramic substrate 40 bears against the bottom of outer wall portion 63 of the upper lattice structure. In this way, low impedance electrical paths are established from the upper lattice structure 60 by way of four sets of leaf springs 68 to the conductive cap 52 of each LSI package. Thermally conductive but electrically nonconductive material such as grease is applied on the upper surface of each LSI package 5 to form a layer 57 as shown in FIGS. 2 and 3. The cooling device 7 has meandering passageways 70 between a coolant inlet 71 and a coolant outlet 72, and defines an array of square-shaped cooling portions 73 corresponding to the apertures 62 of the upper lattice structure. The cooling portions 73 are positioned in the corresponding square apertures 62 and establish thermal contact with conductive caps 52 by way of the respective grease layers 57 so that heat generated in LSI chips 50 is efficiently conducted to the cooling device 7.

As seen in FIGS. 1 and 2, the upper lattice structure 60 has portions 69 extending from its four sides beyond the periphery of cooling device 7 to facilitate connection to a power voltage source, not shown. It is seen therefore that source currents applied to the outwardly extending portions 69 of upper lattice structure 60 6 find their passage through bars 61, springs 68, metal caps 52 the conductive pattern 55 embedded in base plate 51 and leads 56 to all LSI chips 50 of the module. Ground currents from all LSI chips are drained through ground leads 54, ground layers 43 and ground pins 41 to printed circuit board 1. Therefore, shorter current paths are achieved with the present invention while allowing an increase in the number of current paths and pin connectors.

The foregoing description shows only one preferred embodiment of the present invention. Various modifications are apparent to those skilled in the art without departing from the scope of the present invention which is only limited by the appended claims.

What is claimed is:

1. An electronic circuit module comprising:
    an insulative substrate having an array of male connectors arranged thereon for engagement with external female connectors and an electrically conductive layer of power distribution pattern embedded therein and coupled to said male connectors;
    an array of integrated circuit packages, each including an electrically conductive housing, an integrated circuit chip secured thereto in a thermally conductive relationship, a base plate having a conductive pattern embedded therein and connected to said conductive housing, means establishing a source/ground current conduction path between said conductive pattern and said integrated circuit chip, and means establishing a drain/source current conduction path between said integrated circuit chip and the layer of said insulative substrate;
    a spring assembly including an array of electrically conductive springs and means supporting said springs in pressure contact relationship with the conductive housings of successive integrated circuit packages, said spring assembly being adapted to be coupled to an external power voltage terminal for supplying power to said integrated circuit packages; and
    cooling means defining an array of cooling surfaces respectively contacting said conductive housings of the integrated circuit packages in a thermally conductive relationship.

2. An electronic circuit module as claimed in claim 1, wherein said spring assembly comprises:
    a first lattice structure formed by crossed bars of electrically conductive material defining an array of first apertures through which said integrated circuit packages establish said thermally conductive relationship with said cooling means;
    a second lattice structure formed by crossed bars defining an array of second apertures corresponding respectively to the first apertures and through which said integrated circuit packages establish said electrical contact with the layer of said insulative substrate, said first and second lattice structures supporting the array of said springs therebetween, said springs being in said pressure contact relationship with said conductive housings.

3. An electronic circuit module as claimed in claim 2, wherein the the first lattice structure has outwardly extending portions for coupling to a power voltage source.

4. An electronic circuit module as claimed in claim 1, wherein each of said springs exhibits a paired, bow-like configuration.

5. An electronic circuit module as claimed in claim 1, wherein said insulative substrate is formed from a ceramic material.

6. An electronic circuit module as claimed in claim 1, further comprising a frame structure supporting said insulative substrate and said spring assembly therein.

7. An electronic circuit module as claimed in claim 1, further comprising a thermally conductive layer interposed, respectively, between each of said conductive housings and each of said cooling surfaces.

8. An electronic circuit module as claimed in claim 2, wherein said second lattice structure is formed from an insulative material.

* * * * *